(12) United States Patent (10) Patent No.: US 7,568,064 B2
Réblewski et al. (45) Date of Patent: Jul. 28, 2009

(54) PACKET-ORIENTED COMMUNICATION IN RECONFIGURABLE CIRCUIT(S)

(75) Inventors: Frédéric Réblewski, Paris (FR); César Douady, Orsay (FR)

(73) Assignee: M2000, Bievres (FR)

( * ) Notice: Subject to any disclaimer, the term of this patent is extended or adjusted under 35 U.S.C. 154(b) by 263 days.

(21) Appl. No.: 11/358,338

(22) Filed: Feb. 21, 2006

(65) Prior Publication Data

US 2007/0194807 A1 Aug. 23, 2007

(51) Int. Cl.
*G06F 13/42* (2006.01)
*G06F 13/00* (2006.01)
*G06F 13/14* (2006.01)
*G06F 13/36* (2006.01)

(52) U.S. Cl. ...................... 710/317; 710/105
(58) Field of Classification Search ................. 710/105, 710/317
See application file for complete search history.

(56) References Cited

U.S. PATENT DOCUMENTS

| | | | |
|---|---|---|---|
| 6,940,308 B2 * | 9/2005 | Wong | 326/41 |
| 7,062,586 B2 * | 6/2006 | Donlin et al. | 710/305 |
| 7,224,184 B1 * | 5/2007 | Levi et al. | 326/41 |
| 7,304,987 B1 * | 12/2007 | James et al. | 370/360 |
| 2007/0200594 A1 * | 8/2007 | Levi et al. | 326/38 |

FOREIGN PATENT DOCUMENTS

| | | |
|---|---|---|
| WO | WO 00/28684 A1 | 5/2000 |
| WO | WO 02/082653 A2 | 10/2002 |

OTHER PUBLICATIONS

Marescaux et al.; "Interconnection Networks Enable Fine-Grain Dynamic Multi-tasking on FPGAs"; IEEE; Proceedings of the Reconfigurable Computing Is Going Mainstream, 12th International Conference on Field-Programmable Logic and Applications; 2002; pp. 795-805.*
Hilton et al.; "A Flexible Circuit-Switched NOC for FPGA-Based Systems"; IEEE; Proceedings of the 2005 International Conference on Field Programmable Logic and Applications; Aug. 26, 2005; pp. 191-196.*
Bartic et al; "Highly scalable network on chip for reconfigurable systems"; IEEE; Proceedings of International Symposium on System-on-Chip; 2003; pp. 79-82.*
Borgatti, M. et al., "A Reconfigurable System Featuring Dynamically Extensible Embedded Processor, FPGA, and Customizable I/O," IEEE Journal of Solid-State Circuits, IEEE Service Center, Piscataway, NJ, US, vol. 38, No. 3, Mar. 2003 pp. 521-529, XP001158091, ISSN: 0018-9200 the whole document.
Jantsch, A. and H. Tehunen, "Networks on Chip," Kluwer Academic Publishers, Dordrecht, The Netherlands, XP002424567 ISBN: 1-4020-7392-5 *Chapter 2, pp. 19-38.

(Continued)

*Primary Examiner*—Paul R Myers
*Assistant Examiner*—Ryan M Stiglic
(74) *Attorney, Agent, or Firm*—Schwabe, Williamson & Wyatt P.C.

(57) ABSTRACT

A reconfigurable circuit having communication resources configured to facilitate selective packet-oriented communications among reconfigurable resources is described herein.

24 Claims, 6 Drawing Sheets

OTHER PUBLICATIONS

Lertora, F. et al, "Handling Different Computational Granularity by a Reconfigurable IC Featuring Embedded FPGAs and a Network-on-Chip," Field-Programmable Custom Computing Machines, 2005. FCCM 2005. 13th Annual IEEE Symposium on Napa, CA, USA, Apr. 18-20, 2005, Piscataway, NJ, USA, IEEE Apr. 18, 2005, pp. 456-54, XP010841256 ISBN: 0-7695-2445-1 the whole document.

Mondinelli, F. et al., "A 0.13um 1Gb/s/channel store-and-foward network-on-chip" SOC Conference, 2004. Proceedings. IEEE International Santa Clara, CA, USA Sep. 12-15, 2004, Piscataway. NJ, USA, IEEE, Sep. 12, 2004, pp. 141-142, XP010743812 ISBN: 0-7803-8445-8 figure 2.

Murthy, S. et al., "Congestion-oriented shortest multipath routing," Proceedings of IEEE Infocom 1996. Conference on Computer Communications. 15th Annual Joint Conf. of the IEEE Computer and Communications Societies. Networking the Next Generation. San Francisco, Mar. 24-28, 1996, Proceedings of Infocom, L, vol. 2, Conf. 15, Mar. 24, 1996, pp. 1028-1036, XP010158171, ISBN: 0-8186-7293-5 p. 1029, right-hand column, paragraphs 3, 6.

Radulescu, A. et al. "An efficient on-chip NI offering guaranteed services, shared memory abstraction, and flexible network configuration," IEEE Transactions on Computer Aided Design of Integrated Circuits and Systems, IEEE Service Center, Piscataway, NJ, US, vol. 24, No. 1, Jan. 2005, pp. 4-17, XP002343901 ISSN: 0278-0070 the whole document.

Rijpkema, E. et al., "Trade offs in the design of a router with both guaranteed and best-effort services for networks on chip," Design, Automation and Test in Europe Conf. and Exhibition, 2003 Munich, Germany Mar. 3-7, 2003, Los Alomitos, CA, USA, IEEE ISBN: 0-7695-1870-2 *section 4.1.2*.

Rijpkema, E. et al., "Trade offs in the design of a router with both guaranteed and best-effort services for networks on chip—DATE03," IEEE Proceedings E. Computers & Digital Techniques, Institution of Electrical Engineers. Stevenage, GB, vol. 150, No. 5, Sep. 22, 2003, pp. 294-302, XP006021112 ISSN: 0143-7062 the whole document.

Sathe, S. et al., "Desgin of a guaranteed throughput router for on-chip networks" System-on-Chip, 2004. Proceedings. 2004 International Symposium on Tampere, Finland Nov. 16-18, 2004,Piscataway, NJ, USA, IEEE Nov. 16, 2004, pp. 25-28 XP010779385 ISBN: 0-7803-8558-6 *section 2*.

* cited by examiner

PACKET-ORIENTED COMMUNICATION IN RECONFIGURABLE CIRCUIT(S)

TECHNICAL FIELD

Embodiments of the present invention relate to the field of reconfigurable circuit design, in particular, to a reconfigurable integrated circuit with communication resources configured to facilitate selective packet-oriented communications among reconfigurable resources, and related applications.

BACKGROUND

Reconfigurable circuits are circuit devices that may be reconfigured through programming to realize a variety of different functions, so long as the complexities of the desired functions are not too high. One example of a reconfigurable circuit is a Field Programmable Gate Array (FPGA) circuit.

FPGA circuits contain a variety of basic reconfigurable resources in quantities that may be used/reconfigured through programming to realize a variety of different functions. Since an FPGA circuit is reconfigurable, a variety of basic reconfigurable resources are often combined to provide a desired functionality. As FPGA circuit designs will often use several transistors for each transistor of the target function, the overall FPGA surface area required on a given die is among the largest devices to be made with a given integrated circuit technology. As a result, FPGA manufacturers are constantly faced with reducing the size of their circuit designs in an effort to reduce problems in production.

As previously indicated, modern FPGA circuit designs may use several different reconfigurable resources, such as logic gates, wires, memories, arithmetic operators, pads, and even processors in combination for each of the target function(s). Unfortunately, the process of connecting these reconfigurable resources in a reconfigurable manner often requires dedication of substantial portions of the available space and metal layers to wiring resources. As a result, the large scale use of associated wiring resources for connectivity is problematic for FPGA devices especially as the metal layers are already very crowded, further increasing both size and complexity of corresponding FPGA designs

BRIEF DECRIPTION OF THE DRAWINGS

The present invention will be described by way of exemplary embodiments, but not limitations, illustrated in the accompanying drawings in which like references denote similar elements, and in which.

Figure 3:
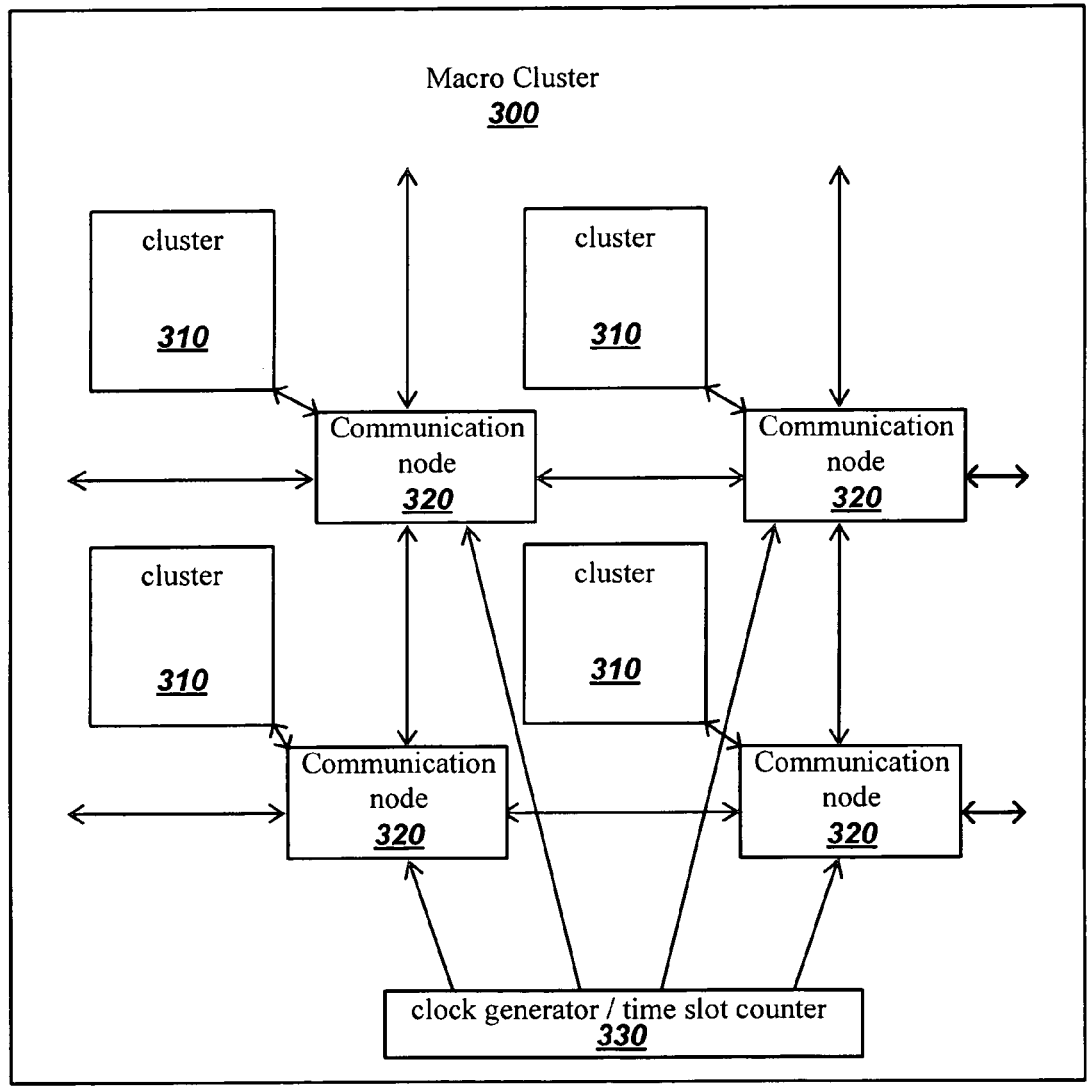
FIG. 3 illustrates a block diagram of a portion of a macro-cluster, employing clusters and network nodes, in accordance with at least one embodiment of the present invention.
Figure 5:
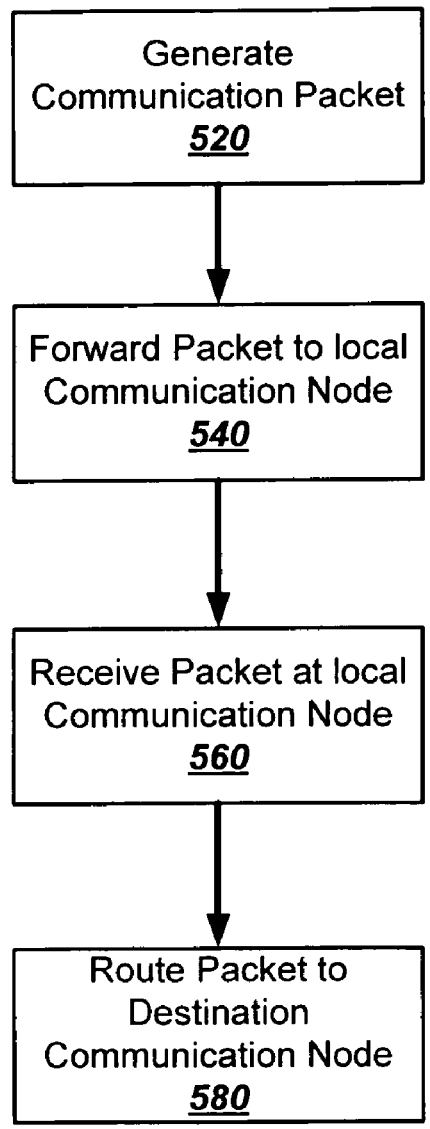
Figure 6:
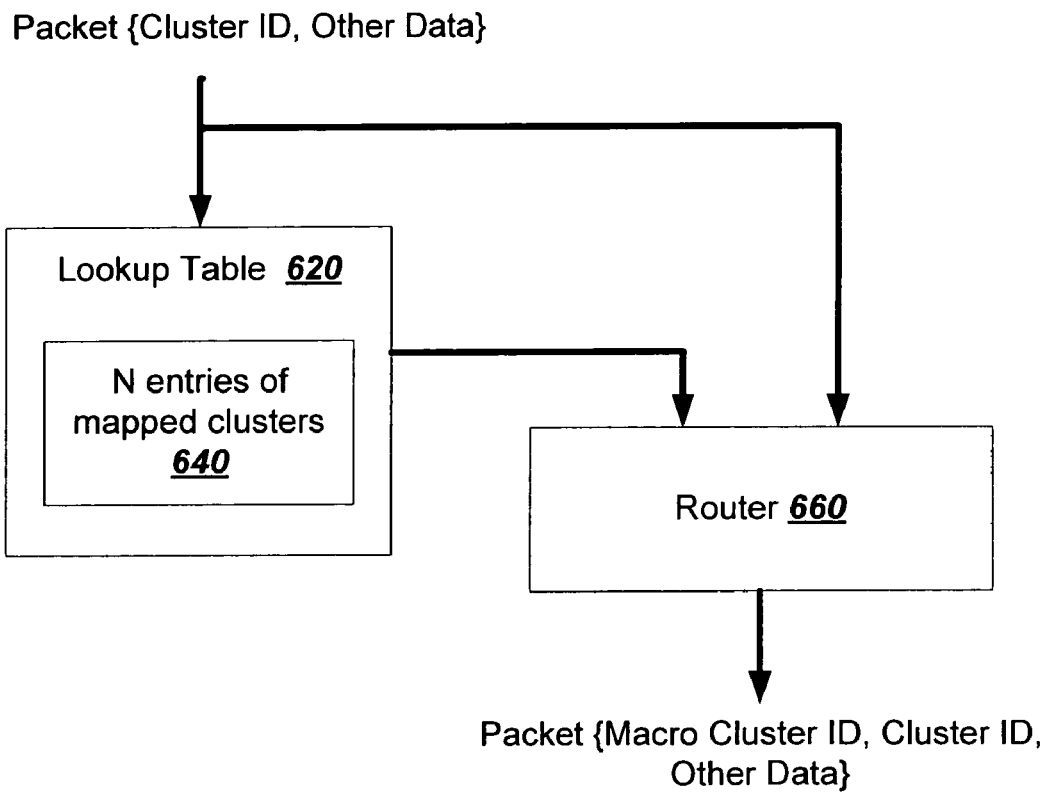

FIG. 5 illustrates a flowchart view of a portion of methods of operation of the reconfigurable circuit as presented in FIG. 3 in further detail, according to at least one embodiment of the present invention; and FIG. 6 illustrates a circuit diagram of a portion of a reconfigurable circuit, employing a look-up table and router to deliver packets to a destination cluster, in accordance with at least one embodiment of the present invention.

DETAILED DESCRIPTION

To overcome the herein afore-mentioned disadvantages of the heretofore-known devices of this general type, embodiments of the present invention provide a reconfigurable circuit with communication resources configured to facilitate selective packet-oriented communications among available reconfigurable resources. More specifically, in various embodiments, each of the communication resources are coupled to one or more of the reconfigurable resources and to one or more of the other communication resources, the communication resources including a plurality of communication nodes, each node including at least one data crossbar to facilitate routing of packet-oriented communications among the reconfigurable resources, at least one pipeline register to temporarily store packets, and a routing table to store routing information for received packets.

In the following detailed description, reference is made to the accompanying drawings which form a part hereof wherein like numerals designate like parts throughout, and in which are shown, by way of illustration, specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment, but they may. The phrase "A/B" means "A or B". The phrase "A and/or B" means "(A), (B), or (A and B)". The phrase "at least one of A, B and C" means "(A), (B), (C), (A and B), (A and C), (B and C) or (A, B and C)". The phrase "(A) B" means "(A B) or (B)", that is "A" is optional.

Figure 1:
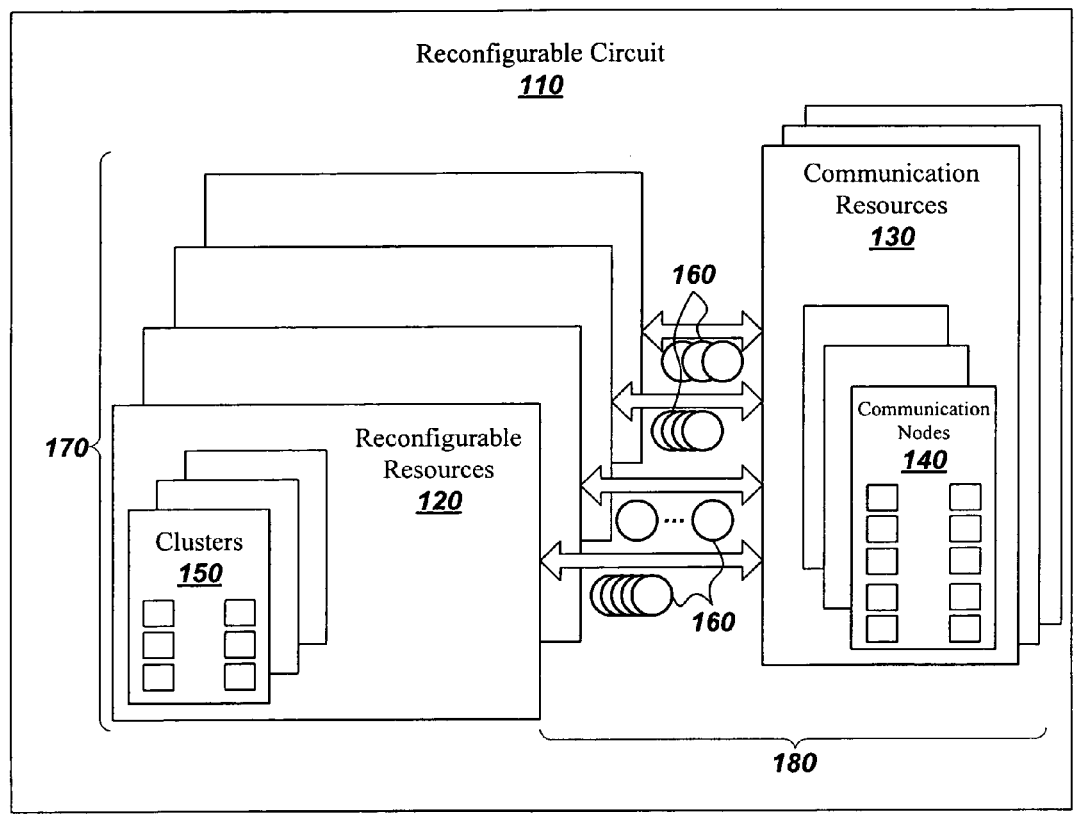
FIG. 1 illustrates a block diagram of a system with multiple FPGA circuits in a reconfigurable circuit, employing selective packet-oriented communications among the reconfigurable resources, in accordance with at least one embodiment of the present invention.

Referring now to FIG. 1, a block diagram of a reconfigurable circuit 110, employing selective packet-oriented communications among the reconfigurable resources 120, in accordance with at least one embodiment of the present invention, is shown.

As illustrated and described earlier, in various embodiments, a reconfigurable circuit 110 with a plurality of reconfigurable resources 120 and a plurality of communication resources 130 is provided where each of the communication resources 130 are coupled to one or more of the reconfigurable resources 120 and to one or more of the other communication resources 130 to communicate selective packet-oriented communications among the reconfigurable resources 120.

In accordance with another feature of at least one embodiment of the invention, the plurality of reconfigurable resources 120 are organized into a plurality of clusters 150, each cluster 150 having a subset of the reconfigurable resources 120. In various embodiments, reconfigurable resources may include basic logic gates, wiring resources, configurable memory, arithmetic operators, processors, configurable pads, and the like. Basic logic gates are usually a configurable function with inputs, outputs and the possible presence of a flip-flop. In one embodiment, the configurable functions of the basic logic gates include functions having about 4 or 5 inputs with about 1 or 2 outputs. Wiring resources, according to one embodiment, include the physical links between other resources and usually include crossbars and/or switch boxes that can be connected to other functions or wiring resources. Configurable memories, in one embodiment, are dual port memories with configurable geometries. In one embodiment, arithmetic operators are capable of processing addition and multiplication operations. Arithmetic operators are particularly useful in Digital Signal Processing (DSP) applications. Configurable pads in various embodiments are often configured to enforce most well known electrical and timing specifications. For example, the configurable pads may include Serializer-Deserializer (SERDES) operations. For some reconfigurable resources, embedded micro-controllers and/or processors are available to applications so that a part of the applications can be implemented in software.

In accordance with a further feature of one embodiment, the plurality of communication resources 130 includes a plurality of communication nodes 140 with at least one of the communication nodes 140 being coupled to a cluster 150 of the reconfigurable resources 120 and at least one other communication node 140.

In accordance with a concomitant feature of one embodiment, the reconfigurable circuit 110 is at least one Field Programmable Gate Array (FPGA). As such, various embodiments describe a new basic resource for use in FPGA based designs. In addition to logic gates, wires, memories, arithmetic operators, pads and processors that are sometimes available in FPGA, various embodiments of the present invention describe the configuration and the use of a packet-oriented network to carry application data within the FPGA. Such a network is faster, less expensive and more flexible than the equivalent designs using direct wire resources and logic gates. Moreover, the packet-oriented network can be advantageously exploited in most FPGA designs, making packet-oriented networks a potential candidate to qualify as a basic FPGA resource.

When an application is designed onto a large FPGA array, the operating frequency is eventually limited by long distance communications. Exemplary long distance communications include communications between points of the FPGA that are too far apart to be completed in one clock cycle. This distance may be determined by the relevant laws of physics together with the state of the current FPGA design technology. However, even some theoretically "possible" connections may be logistically hindered due to the FPGA configuration, which in practice may not be fast enough. As a result, one embodiment facilitates decoupling the latency from the operating frequency, in part by accepting that the global communication may take longer than a single clock cycle and that the logic gates at the extremities of the link may identify more than they can reach in a single clock cycle. One method to accomplish this decoupling is to initiate a packet-oriented communication model.

Fortunately, in an FPGA environment the packet-oriented communication model may establish the communication channels when the FPGA is first being configured, because the various applications at this early stage barely use the communication channels. In one embodiment, each communication channel may have one transmitter and may include several receivers, such that each packet is transmitted by the transmitter and received by at least one of the receivers. Moreover, the FPGA environment is also conducive to an optimized packet communication system, because the packets that are sent by the transmitter are virtually guaranteed to arrive at the intended destination. As for the primary clock scheme, in one embodiment, the latency has an upper bound and the bandwidth has a lower bound. For one embodiment using the fully synchronous secondary clock scheme, the latency and the bandwidth are fixed values.

Figure 2A:
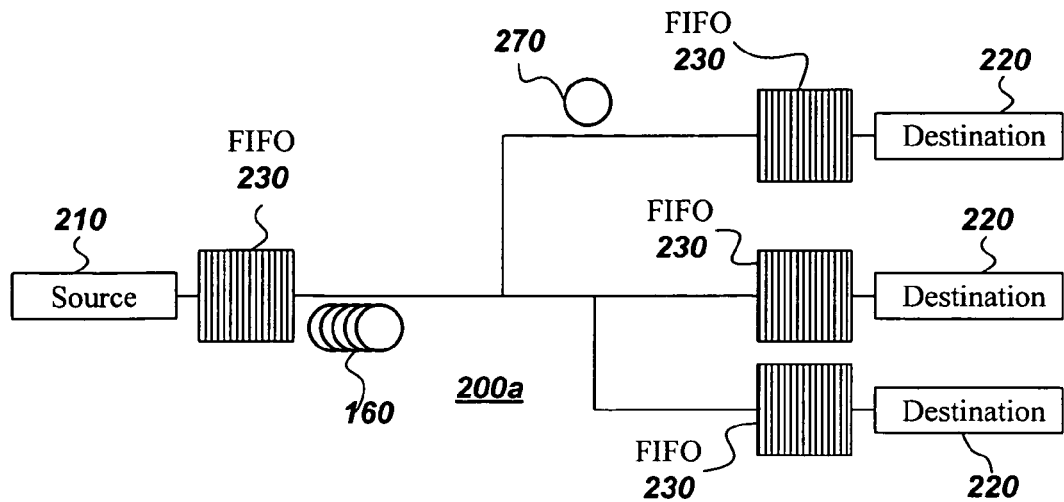
FIGS. 2A and 2B illustrate block diagrams of intervening communication devices and data pathways between source and destination in a system as presented in FIG. 1 in further detail, according to various embodiments of the present invention.
Figure 2B:
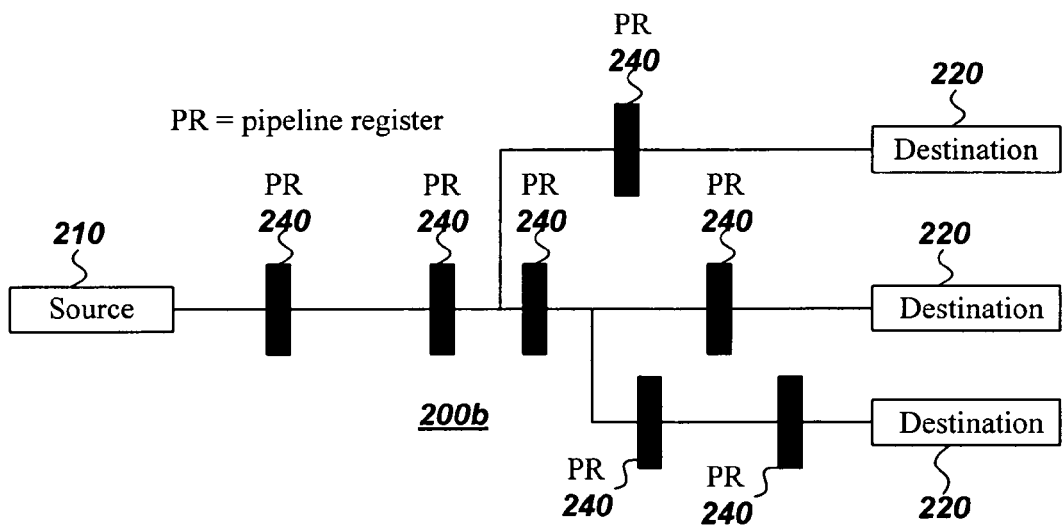

Referring now to FIGS. 2A and 2B, block diagrams of two operational modes to initiate a packet-oriented communication model with a reconfigurable circuit 100 as previously presented in FIG. 1 are shown in further detail, specifically including some of the intervening communication devices and data pathways between source 210 and multiple destinations 220 according to the various operational embodiments of the present invention. Alternatively, one embodiment connects each source with only one destination.

At the time of configuration, each connection between source 210 and destination 220 may be routed within the system 200, such that each link or segment is either fully dedicated to synchronous communication or partially allocated to an asynchronous connection through a time slot table. Other configurations may also be used, such as including support for a partially synchronous communication network.

In a first operational mode, illustrated in FIG. 2A, an asynchronous communication model is used. Once the network is configured, the application using the network may identify or have access to a set of asynchronous links. On each link, cells or packets are transmitted from the source to one of the destinations. A flow control is enforced and a FIFO-like interface 230 is provided on both the source 210 and destination 220 sides. In this configuration it is not necessary to have the same clock at each access point. However, a primary synchronous clock within the communication network is necessary to operate the communication network in this mode.

For asynchronous connections, there must be a flow control to avoid FIFO 230 overflows. This flow control is credit based. For example, in one embodiment, when a new entry is available in the receiving FIFO 230, a credit 270 is sent to the transmitting end or source 210 to inform it that an additional word can be sent over the connection. The transmitting end or source 210 maintains a counter of unused credits 270, which is incremented each time a credit 270 is received and decremented each time a word is sent in a packet 160. No word is sent if the credit counter is 0. Because credits 270 travel in the reverse direction compared to data packets 160, in one embodiment, a routing table may be used to route credits 270 and can be the same as the one used to route data packets 160, except that it is addressed in the reverse order.

When an asynchronous connection goes from node $A_1$ to node $A_n$ through nodes $A_2, \ldots, A_{n-1}$, for every i between 1 and n−1, the corresponding node $A_{i+1}$ is a direct neighbor of node $A_i$, time slot $T_0+i$ is assigned to the segment that goes from $A_i$ to $A_{i+1}$. Note that in the case a link is provided from a node to itself, a node is considered to be a neighbor of itself and hence can be repeated several times in this list of nodes. This can be useful to improve the time slot allocation efficiency.

In a second operational mode, illustrated in FIG. 2B, a synchronous communication model is used. Once the network is configured, the application using the network may detect or have access to a set of synchronous links. On each link, transmitted from the source 210 to one of the destinations 220 via a series of links and segments including several intervening pipeline registers 240. The synchronous model requires that the same clock be used at the ends of the link, the unique source 210, and all the destinations 220. The synchronous communication model is equivalent to providing a certain number of dedicated wired connections each associated with some pipeline registers. In one embodiment of the synchronous communication model, flow control, signalization, or FIFO buffers are not provided for in the synchronous communication model.

Referring now to FIG. 3 a block diagram of a portion of a macro-cluster 300, employing clusters 310 and communication nodes 320, in accordance with at least one embodiment of the present invention is shown. The macro-cluster 300 includes a plurality of clusters 310 and a plurality of communication nodes 320 with at least one of the communication nodes 320 being coupled to a cluster 310 and at least one other communication node 320.

In one embodiment, the underlying topology includes a two dimensional grid to make the physical links between the communication nodes 320 uniform and/or as short as possible. In the illustrated macro-cluster 300, each interior communication node 320 is connected to neighboring communication nodes 320 on each of the four sides. In one embodiment, this configuration makes a clock frequency of 500 MHz accessible when using 90 nm technology. Other physical topologies may also be used within macro-cluster 300 in accordance to design preferences and various operating conditions.

In one embodiment, each communication node 320 includes at least one input from each neighboring communication node, at least one input from each attached cluster, optionally at least one delay loop to delay packets or cells that need to spend more than a single clock cycle in the node to ease the timeslot allocation, at least one output to each neighboring communication node, at least one output to each attached cluster, a crossbar to route data, another crossbar to route tokens and/or credits, a pipeline register on all outputs of the data crossbar configurable to be clocked by either a network clock or a location/application clock, and a pipeline register on all outputs of the credit and/or token crossbar to be clocked by a network clock.

The macro-cluster 300 also includes a clock generator/time slot counter 330, which may or may not be coupled to clocks or counters external to the macro-cluster 300. If there is a global time slot counter, T, then the global time slot counter will run on the network clock.

Figure 4:
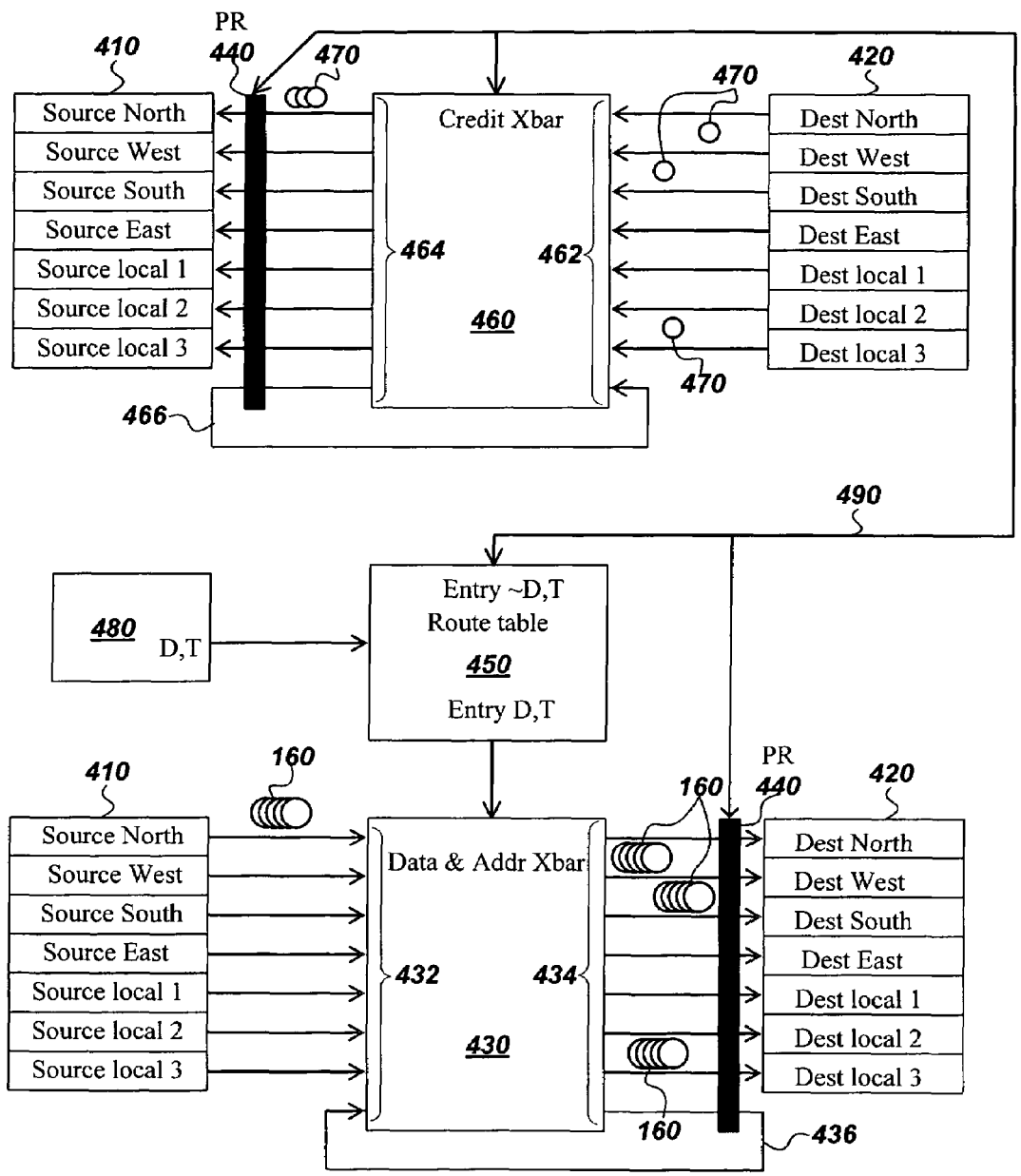
FIG. 4 illustrates a block diagram of a portion of crossbar devices facilitating communication between source and destination, in accordance with at least one embodiment of the present invention.

Referring now to FIG. 4, a block diagram of a portion of a communication node 140 is shown, more specifically crossbar devices 430 and 460 facilitating communication between source 410 and destination 420, in accordance with at least one embodiment of the present invention, the communication node 140 having one or more data crossbars 430, one or more pipeline registers 440, and a routing table 450. The data crossbars 430 having input ports 432 and output ports 434 and adapted to facilitate routing communication packets 160. The routing table 450 adapted to store routing information specifying routing of communication packets 160 received at the input ports 432 of the data crossbars 430 to output ports 434 of the data crossbars 430. In one embodiment, the one or more pipeline registers 440, at least one pipeline register for each destination, are coupled to the output ports 434 of the data crossbars 430 to temporarily store the communication packets 160. In accordance with an additional feature of one embodiment, the communication node 140 is further coupled, via at least one output port to itself.

In accordance with an added feature of at least one embodiment, the communication node 140 further comprises a credit crossbar 460 adapted to facilitate routing of credits 470 among the communication nodes 140. In accordance with yet another feature of one embodiment, the credit crossbar 460 has a plurality of output ports 464, each output port coupled with another one or more pipeline registers 440, at least one pipeline register for each source, in the communication node 140. The pipeline registers 440 are coupled to the output ports 464 of the credit crossbar 460 to temporarily store the credits 470 being routed. In accordance with yet an additional feature of one embodiment, the credit crossbar 460 includes a plurality of input ports 462, and is further adapted to sum up the credits 470 received through a number of input ports 462 to be routed to an output port 464.

As a given connection may have several receivers or destinations, in the credit crossbar 460, there may be several input ports 462 connected to a single output port 464 during a given clock cycle. And because credits 470 can come from several inputs at the same time, the credit crossbar 460 must be able to add up all the input ports 462 connected to an output port 464. Adders are generally only necessary if several receivers are authorized for a given connection. If connections are restricted exclusively to one-to-one connections, a plain crossbar can be used for the credit crossbar 460.

In accordance with yet a further feature of one embodiment, there is provided a time slot counter 480 coupled to the routing table 450 to output addresses for the routing table 450, the time slot counter 480 adapted to count forward for the data crossbar 430 and count backward for the credit crossbar 460. In accordance with yet another feature of one embodiment, the time slot counter 480 comprises two component parts, D and T, with T counting up when D=0 and T counting down when D=1, and D becoming 1 when T reaches its maximum value and D becoming 0 when T reaches its minimum value.

In one embodiment, to simplify the routing table design and avoid a dual ported memory, a particular encoding of the time slot number is applied. Specifically, the routing table 450 is first addressed with T, providing two entries, call them A and B. If D is 0, use entry A for data and entry B for credits, and vice versa if D is 1. In this manner, only the final few multiplexors are doubled and a single ported memory can be used.

In one embodiment, the time slot counter 480 counts repeatedly from 0 to TS/2-1 and then back from TS/2-1 down to 0, where TS is the size of the time-slot tables. An additional bit D is 0 when counting up and 1 when counting down. The couple (D,T) is a particular encoding of numbers from 1 to TS. While this particular encoding makes the implementation of the time-slot tables easier, it is not compulsory and other configurations should be considered within the scope of the present invention.

During each network clock cycle, (D,T) is used as an index to extract an entry in the routing table 450. The entry describes for each output of the data crossbar the input to be fed to it.

The routing table may also be used on a macro cluster level as illustrated in FIG. 6, where a portion of a reconfigurable circuit, employing a look-up table 620 and router 660 to deliver packets to a destination cluster, in accordance with at least one embodiment of the present invention is shown. Specifically, the lookup table 620 includes N entries 640 of mapped cluster identifiers within the participating macro clusters so that packets may be routed within and/or between macro clusters. In accordance with a feature of one embodiment there is provided at least one look-up table 620 with entries 640 from mapped clusters from at least one macro cluster and entries for at least one other macro cluster. If it is determined that the packet needs to be sent outside of the local macro cluster, in one embodiment, a router 660 is configured to append a macro cluster ID to the cluster ID and to other data in each packet based on the entry 640 from the lookup table 620.

Each segment starting at a given node can then be used in two ways, asynchronous connections and synchronous connections. In several asynchronous connections, each connection uses the segment during one or more time slots, as mentioned in the routing table 450. In this asynchronous mode, the pipeline register 440 at the output of the crossbar 430 is clocked by the network clock. When used in a single synchronous connection, all the entries of the routing table 450 mention the same input for the output leading to the segment. In this synchronous mode, the pipeline register 440 at the output of the crossbar 430 is clocked by the clock of the connection. In one embodiment, all the entries in the routing table 450 mention the same input, so that associating individual counts by the time slot counter with the network clock rather than the clock of the individual connections does not matter.

In accordance with again another feature of one embodiment there is provided one or more clock lines 490 to provide one or more clocks, and wherein the one or more pipeline registers 440 of the communication node 140 are coupled to one of the one or more clock lines 490 to be clocked independent of the reconfigurable resources 120.

In accordance with again a further feature of one embodiment there is provided one or more clock lines 490 to provide one or more clocks, and wherein the one or more pipeline registers 440 of the communication node 140 are coupled to one of the one or more clock lines 490 to be clocked synchronously with at least one reconfigurable resource 120.

In accordance with yet another feature of one embodiment, there is provided one or more clock lines 490 to provide one or more clocks, and wherein the one or more pipeline registers 440 of the communication node 140 are coupled to one of the one or more clock lines 490 to be selectively clocked either independent of the reconfigurable resources 120 or synchronously with at least one reconfigurable resource 120.

The sizes of the credit crossbar 460, data and address crossbar 430, and routing table 450 are often relative to the designed system. For example, in one embodiment, the system includes a data path having a width, W between about 16 and 32 and the maximum number of destinations, K, for a given connection is between about 3 and/or about 7. Accordingly, the number of bits, WA, to encode K+1 states would then be between about 2 or 3 bits. The full round trip diameter, D, within such a system is generally between about 16 and 32. A single connection within the system is configured to transmit a packet every R cycles to maintain a desired performance level. Further, each node makes N connections to or from a cluster. In one configuration, each node includes a connection to itself, the maximum number of connections with the cluster (between about 1 and 3 connections), and all four (north south, east, and west) of the directional connections. The associated data crossbar would then be a (4+1+N)×(4+1+N) crossbar having a width W+WA to route the data. The associated credit crossbar would also be sized as a (4+1+N)×(4+1+N) crossbar of width WA. Where the credit crossbar is able to add all inputs connected to each output, as it is possible during a given cycle that several inputs are routed to the same output. Similarly, the number of available time slots, TS, for such a system is typically between about 8 and 32 slots within the system.

In one configuration, the underlying topology used to implement the application topology is a 2D grid of logic clusters. In the 2D grid of logic clusters each node of the network is connected to its 4 neighbors that are at its north, east, south and west. However, it must be observed that any physical topology may be used and that a 2D grid is just one possible choice. The described 2D grid implementation is made out of links that run between the logic clusters. In one embodiment using 90 nm technology, each logic cluster being about 2 mm in diameter and with such a 2D grid topology, a clock frequency of about 500 MHz is accessible.

In one alternative configuration, the links may be designed to go through the logic clusters. Using 90 nm technology, these links connecting the previously described logic clusters would not need to be more than about 2 mm long.

Referring now to FIG. 5, a flowchart of a portion of one method of operation of the reconfigurable circuit as presented in FIG. 3 is shown. In at least one embodiment of the present invention, a method of operation of a reconfigurable circuit is described, which includes generating a communication packet by a cluster of reconfigurable resources of the reconfigurable circuit in block 520. Block 540 includes forwarding the communication packet to a communication node coupled to the cluster for routing and delivery to one or more other clusters of reconfigurable resources of the reconfigurable circuit. In accordance with a further mode of at least one embodiment of the invention, the communication node receives the communication packet at an input port of a data crossbar in block 560, and routes the communication packet to an output port of the data crossbar in block 580.

In accordance with an added mode of one embodiment of the invention, the communication node temporarily stores the communication packet in a pipeline register coupled to the output port of the data crossbar. In accordance with an additional mode of one embodiment of the invention, the communication node stores the communication packet in a pipeline register, and independently clocks the pipeline register.

In accordance with yet another mode of one embodiment of the invention, the one or more other clusters are coupled to at least one other communication node that is coupled to the communication node, and the pipeline registers of the communication nodes employed to deliver the communication packet are clocked synchronously.

Although specific embodiments have been illustrated and described herein, it will be appreciated by those of ordinary skill in the art and others, that a wide variety of alternate and/or equivalent implementations may be substituted for the specific embodiment shown and described without departing from the scope of the present invention. This application is intended to cover any adaptations or variations of the embodiment discussed herein. Therefore, it is manifested and intended that the invention be limited only by the claims and the equivalents thereof.

What is claimed is:

1. A reconfigurable circuit, comprising:
a plurality of reconfigurable resources; and
a plurality of communication resources to facilitate selective packet-oriented communications among the reconfigurable resources, each communication resource coupled to one or more of the reconfigurable resources and to one or more of the other communication resources, the plurality of communication resources including a plurality of communication nodes, at least one communication node to receive communication packets from a source communication node and route the communication packets to a destination node, the at least one communication node including:
one or more data crossbars to facilitate routing communication packets from the at least one communication node to the destination communication node;

a credit crossbar to facilitate routing of credits from the at least one communication node to the source communication node; and one or more pipeline registers coupled to output ports of the credit crossbar to temporarily store the credits being routed from the at least one communication node to the source communication node.

2. The reconfigurable circuit as recited in claim 1, wherein the plurality of reconfigurable resources are organized into a plurality of clusters, each having a subset of the reconfigurable resources;

each of the communication nodes being coupled to a cluster of the reconfigurable resources and to at least one other communication node; and at least one communication node further including a routing table to store routing information specifying routing of communication packets received at input ports of the data crossbars to output ports of the data crossbars.

3. The reconfigurable circuit as recited in claim 2, wherein the at least one communication node is further coupled back to itself forming a delay loop to selectively delay packets.

4. The reconfigurable circuit as recited in claim 2, wherein the credit crossbar is to facilitate routing of credits from the at least one communication node to the source communication node based at least in part on the source communication node being available to receive a communication packet.

5. The reconfigurable circuit as recited in claim 2, wherein the at least one communication node further comprises a time slot counter coupled to the routing table to output addresses for the routing table, the time slot counter to count forward for the data crossbar and count backward for the credit crossbar.

6. The reconfigurable circuit as recited in claim 5, wherein the time slot counter comprises two parts D and T, with T counting up when D=0 and T counting down when D=1, and D becoming 1 when T reaches its maximum value and D becoming 0 when T reaches its minimum value.

7. The reconfigurable circuit as recited in claim 2, wherein the routing table is to store routing information specifying routing of communication packets from the at least one communication node to the destination communication node based at least in part on credits routed to the at least one communication node from the destination communication node.

8. The reconfigurable circuit as recited in claim 1, wherein the credit crossbar comprises a plurality of input ports, and further to sum up the credits received through a number of input ports to be routed to an output port.

9. The reconfigurable circuit of claim 1, wherein the reconfigurable circuit is a Field Programmable Gate Array.

10. The reconfigurable circuit as recited in claim 1, wherein the at least one communication node further includes:

another one or more pipeline registers coupled to output ports of the data crossbars to temporarily store the communication packets being routed from the at least one communication node to the destination communication node.

11. The reconfigurable circuit as recited in claim 10, where the reconfigurable circuit further comprises one or more clock lines to provide one or more clocks, and wherein the first and second pipeline registers of the at least one communication node are coupled to one of the one or more clock lines to be clocked independent of the reconfigurable resources.

12. The reconfigurable circuit as recited in claim 10, wherein the reconfigurable circuit further comprises one or more clock lines to provide one or more clocks, and wherein the first and second pipeline registers of the at least one communication node are coupled to one of the one or more clock lines to be clocked synchronously with at least one reconfigurable resource.

13. The reconfigurable circuit as recited in claim 10, wherein the reconfigurable circuit further comprises one or more clock lines to provide one or more clocks, and wherein the first and second pipeline registers of the communication node are coupled to one of the one or more clock lines to be selectively clocked, either independent of the reconfigurable resources or synchronously with at least one reconfigurable resource.

14. The reconfigurable circuit as recited in claim 1, wherein the credit crossbar is to route the credits to the source communication node based at least in part on the at least one communication node being available to receive at least one communication packet.

15. A method comprising generating a communication packet by a cluster of reconfigurable resources of a reconfigurable circuit;

routing a credit from a first communication node to a second communication node;

forwarding the communication packet from the cluster to the second communication node coupled to the cluster for routing to one or more other clusters of reconfigurable resources of the reconfigurable circuit;

the communication packet from the second communication node to the first communication node for further routing and delivery to the one or more other clusters; and the first communication node temporarily storing the credit in a pipeline register coupled to an output port of the credit crossbar.

16. The method of claim 15 further comprising the second communication node receiving the communication packet at an input port of a data crossbar, and routing the communication packet to an output port of the data crossbar for routing to the first communication node, and wherein the routing of the credit comprises routing the credit from an output port of a credit crossbar of the first communication node.

17. The method of claim 16 further comprising the second communication node temporarily storing the communication packet in another pipeline register coupled to the output port of the data crossbar.

18. The method of claim 15 further comprising the second communication node storing the communication packet in a pipeline register, and independently clocking the pipeline register.

19. The method of claim 15 wherein the one or more other clusters are coupled to at least one other communication node coupled to the first communication node, and the method further comprises clocking pipeline registers of the communication nodes employed to deliver the communication packet synchronously.

20. The method of claim 15, wherein the routing of the credit from the first communication node to the second communication node is based at least in part on the first communication node being available to receive at least one communication packet.

21. A system comprising:

a plurality of macro clusters each macro cluster including a plurality of reconfigurable resources and a plurality of communication nodes to facilitate selective packet-oriented communications among the reconfigurable resources, each communication node being coupled to one or more of the reconfigurable resources and to one or more of the other communication nodes, each packet including a cluster identifier; and a plurality of communication resources coupled to the plurality of macro clusters to facilitate selective packet-oriented communications among the reconfigurable resources of the plurality of macro clusters, wherein at least one of the communication nodes to receive communication packets from a source communication node and route the communication packets to a destination node, the at least one communication node including:

one or more data crossbars to facilitate routing communication packets from the at least one communication node to the destination communication node;

a credit crossbar to facilitate routing of credits from the at least one communication node to the source communication node; and one or more pipeline registers coupled to output ports of the data crossbars to temporarily store the communication packets being routed from the at least one communication node to the destination communication node.

22. The system as recited in claim 21, wherein each of the plurality of communication resources include at least one look-up table with entries from mapped clusters from at least one macro cluster and entries for at least one other macro cluster.

23. The system as recited in claim 21, wherein each of the plurality of communication resources include a router to append a macro cluster ID to the cluster ID and to other data in each packet.

24. The system as recited in claim 21, wherein the at least one communication node further includes:

second one or more pipeline registers coupled to output ports of the credit crossbar to temporarily store the credits being routed from the at least one communication node to the source communication node.

* * * * *

UNITED STATES PATENT AND TRADEMARK OFFICE
CERTIFICATE OF CORRECTION

PATENT NO. : 7,568,064 B2 Page 1 of 1
APPLICATION NO. : 11/358338
DATED : July 28, 2009
INVENTOR(S) : Frederic Reblewski It is certified that error appears in the above-identified patent and that said Letters Patent is hereby corrected as shown below:

Column 9, line 15 claim 2, "at least one communication" should read --the at least one communication--.

Signed and Sealed this

Twenty-ninth Day of September, 2009

David J. Kappos
*Director of the United States Patent and Trademark Office*